United States Patent
Corsi et al.

(10) Patent No.: US 6,501,334 B1
(45) Date of Patent: Dec. 31, 2002

(54) ACTIVELY BIASED CLASS AB OUTPUT STAGE WITH LOW QUIESCENT POWER, HIGH OUTPUT CURRENT DRIVE AND WIDE OUTPUT VOLTAGE SWING

(75) Inventors: Marco Corsi, Parker, TX (US); Kenneth G. Maclean, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 35 days.

(21) Appl. No.: 09/711,767

(22) Filed: Nov. 13, 2000

(51) Int. Cl.[7] .............................. H03F 3/26; H03F 3/18
(52) U.S. Cl. ........................ 330/267; 330/263; 330/268
(58) Field of Search ................................ 330/263, 267, 330/268

(56) References Cited

U.S. PATENT DOCUMENTS

| | | | | |
|---|---|---|---|---|
| 4,570,128 A | * | 2/1986 | Monticelli | 330/264 |
| 4,638,260 A | * | 1/1987 | Hamley | 330/254 |
| 5,378,938 A | * | 1/1995 | Birdsall et al. | 327/379 |
| 5,455,533 A | * | 10/1995 | Kollner | 327/484 |
| 5,815,040 A | * | 9/1998 | Barbetta | 330/100 |

\* cited by examiner

*Primary Examiner*—Patricia Nguyen
(74) *Attorney, Agent, or Firm*—W. Daniel Swayze, Jr.; W. James Brady; Frederick J. Telecky, Jr.

(57) ABSTRACT

A class 'AB' amplifier output stage has an active current bias source that provides base drive current to the output transistors that is proportional to the signal input voltage level. The output transistor currents are modulated with the input signal such that the quiescent supply current is reduced to a very small level.

17 Claims, 2 Drawing Sheets

ACTIVELY BIASED CLASS AB OUTPUT STAGE WITH LOW QUIESCENT POWER, HIGH OUTPUT CURRENT DRIVE AND WIDE OUTPUT VOLTAGE SWING

BACKGROUND OF THE INVENTION

1. Field of the Invention

This invention relates generally to ADSL line driver circuits, and more particularly to an actively biased class AB amplifier output stage to achieve very low quiescent current for an ADSL line driver.

2. Description of the Prior Art

In an application such as an ADSL central office, where the communication signal has a large crest factor, line drivers are used to provide the requisite large line currents generally associated with low distortion output stages having large output voltage swings. A conventional low distortion power amplifier class 'AB' output stage 100 such as illustrated in FIG. 1 provides a good output swing and has an output current that is limited to the bias current 'I' multiplied by the Hfe of, for example, an NPN source transistor 102 or a PNP sink transistor 104. Such amplifiers are common in ADSL communications since they represent a good balance between distortion and quiescent power (power dissipated during idle periods). To accommodate the large crest factors associated with ADSL communications, the class 'AB' output stage depicted in FIG. 1 is generally modified as illustrated in FIG. 2 to achieve a current gain that is the product of two transistor gains (Hfe1*Hfe2) as contrasted with the single transistor Hfe current gain associated with the amplifier of FIG. 1. In this way, the ratio of signal current to quiescent current is significantly increased, thereby significantly increasing amplifier efficiency. The amplifier 200 shown in FIG. 2, however, is problematic in that it significantly increases the amount of supply voltage headroom required to operate the amplifier for a given output voltage. Since the amplifier 200 is required to be differential to support ADSL, the headroom necessary to operate the amplifier 200 will be approximately two times the voltage drop across the current source 202 (typically 2*0.2V=0.4V) plus four transistor Vbe voltage drops (typically 4*0.9V=3.6V) required by the two amplifier output transistors 204, 206, as well as two additional amplifier output transistors (not shown). The available supply voltage typically then will be reduced by 4.0 volts which is unacceptable for a system having only a 15 volt supply, for example, since only 11 volts would be available to support the large voltage swings necessary to support ADSL communications.

In view of the foregoing, a need exists for an ADSL line driver amplifier that has high drive capability in combination with lower quiescent current drain and more efficient use of available supply voltage than currently available using conventional class 'AB' line driver output stages.

SUMMARY OF THE INVENTION

To meet the above and other objectives, the present invention provides an actively biased class 'AB' amplifier output stage suitable for supporting ADSL applications. The actively biased class 'AB' amplifier output stage reduces the quiescent current required in low distortion amplifiers. The actively biased class 'AB' amplifier output stage further provides high drive capability from low quiescent current while simultaneously achieving efficient utilization of available supply voltage.

According to one embodiment, an input signal is applied to a bias circuit having a load resistor $R_B$ as well as the input of the amplifier output stage connected in a unity gain configuration. The load resistor $R_B$ is connected at the output of the bias circuit to set the boost current $I_{BOOST}$. The current available to drive the amplifier output stage transistors is now modulated in such a way that it is proportional to the collector current demanded by the load ($R_{LOAD}$). The load resistor $R_B$ can be a resistor or a combination of resistor and/or capacitor and/or inductor in series or parallel to boost the bias current in such a way as to satisfy the current requirements of the load ($R_{LOAD}$). A capacitor in parallel to $R_B$ also provides bias to drive parasitic capacitance of the output transistors in a high slew condition.

In one aspect of the invention, a class 'AB' amplifier output stage is biased that exhibits very low distortion.

In another aspect of the invention, a class 'AB' amplifier output stage is implemented such that the current available to drive the output transistors is modulated in such a way that it is proportional to the collector current demanded by the load.

In yet another aspect of the invention, a class 'AB' amplifier output stage is implemented that has high drive capability in combination with lower quiescent current drain and more efficient use of available supply voltage than currently available using conventional class 'AB' line driver output stages.

In still another aspect of the invention, a class 'AB' amplifier output stage is implemented that provides enhanced power efficiency for an ADSL central office line driver where the communication signal has a large crest factor.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
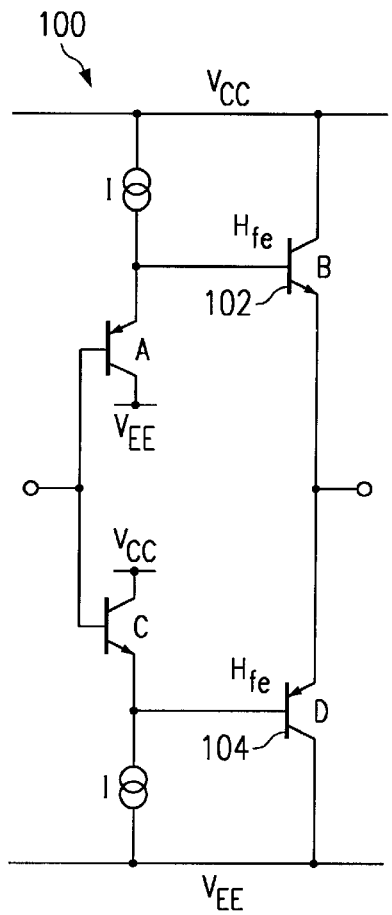
FIG. 1 is a schematic diagram illustrating a conventional class 'AB' amplifier output stage that is known in the prior art.
Figure 3:
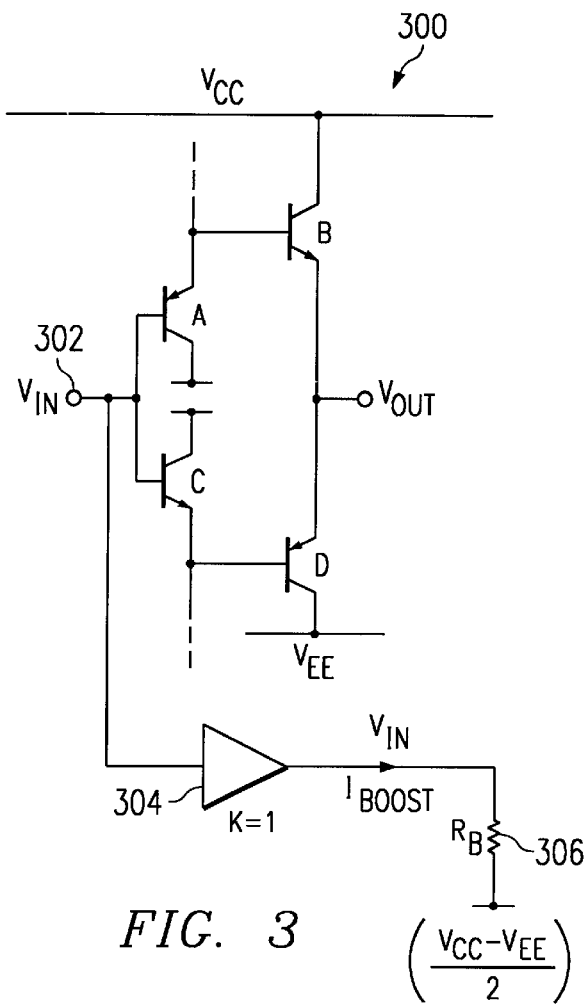
FIG. 3 is a simplified schematic diagram illustrating a class 'AB' amplifier output stage according to one embodiment of the present invention.
Figure 2:
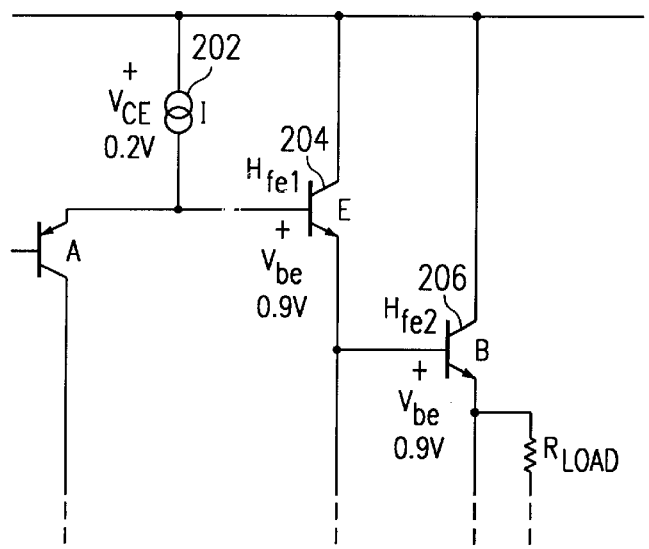
FIG. 2 is a schematic diagram illustrating a conventional ADSL line driver class 'AB' amplifier output stage.

Looking now at FIG. 3, a simplified schematic diagram illustrates a class 'AB' amplifier output stage 300 according to one embodiment of the present invention. As stated herein before, conventional class 'AB' amplifier output stages 100, 200 such as depicted in FIGS. 1 and 2 are problematic in that the available current that can be driven into a load is set by a fixed current source I. The nature of the present invention is to replace the fixed static current sources I with dynamic current sources such that the amount of current available to drive the amplifier output transistors is no longer determined by fixed current sources, but is now dependent on the value of a voltage signal that is required to be driven at the amplifier output. With continued reference now to FIG. 3, the input voltage signal $V_{IN}$ 302 which is applied to the class 'AB' amplifier input, is also applied to a voltage (buffer) amplifier 304 that has a gain of +1 such that $V_{IN}$ 302 appears at the output of the buffer amplifier 304. A load resistor $R_B$ 306 is provided between the buffer amplifier 304 output and the mid-supply $$\left(\frac{V_{CC} - V_{EE}}{2}\right)$$

(which is 0V in a dual symmetrical supply condition), such that a boost current $I_{BOOST}$ is caused to flow through the load resistor $R_B$ 306.

Figure 4:
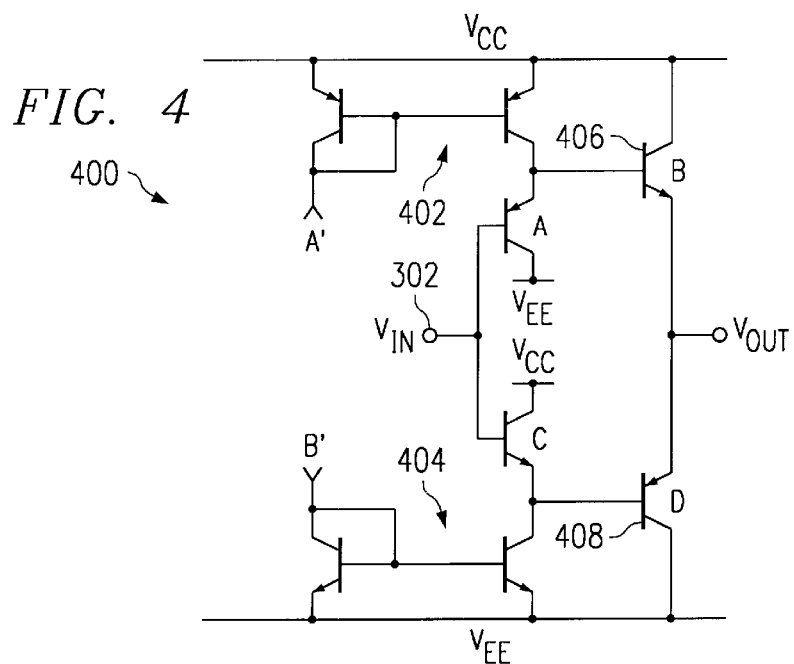
FIG. 4 is a schematic diagram illustrating the class 'AB' amplifier output stage depicted in FIG. 1 modified with dynamic current mirrors for supplying collector currents for the amplifier output transistors according to one embodiment of the present invention.
Figure 5:
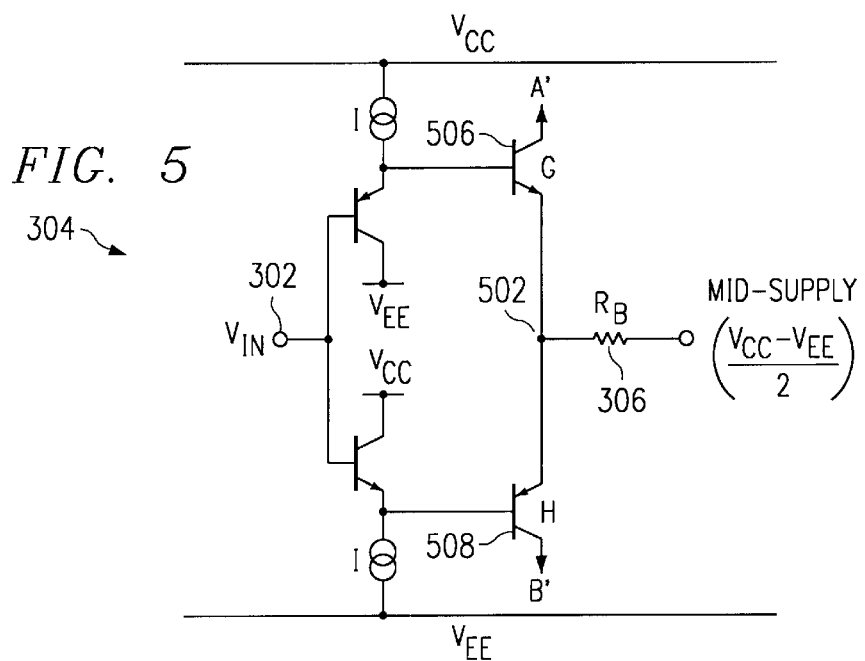
FIG. 5 is a schematic diagram illustrating an active biasing circuit suitable for supplying the current to the current mirrors shown in FIG. 4 to implement an actively biased class 'AB' amplifier output stage according to one embodiment of the present invention.

A practical implementation of the buffer amplifier 304 is shown in FIG. 5 that illustrates an active biasing circuit suitable for supplying the current to the current mirrors 402, 404 shown in FIG. 4 to implement an actively biased class 'AB' amplifier output stage 400 according to one embodiment of the present invention. The active biasing circuit is very similar to the class 'AB' amplifier circuit 100 shown in FIG. 1, except the active biasing circuit drives very low levels of current in contradistinction with the amplifier circuit 100 that drives the full signal current. Again, $V_{IN}$ 302 is applied to the input of the active biasing circuit (buffer amplifier 304) and appears at the output 502, as described herein above with reference also to FIG. 3. The voltage at the output 502 develops a current through load resistor $R_B$ 306 that flows up through transistor 506 and down through transistor 508 during positive and negative-going input signals respectively. The signal current, for example, is supplied through the collector of transistor 508 that is dumped down from load resistor $R_B$ 306 during one negative-going input signal to provide a signal current that is proportional to the input voltage $V_{IN}$ 302 (e.g. the input voltage $V_{IN}$ 302 is scaled by load resistor $R_B$ 306) during the period of the negative-going input signal. When the input voltage $V_{IN}$ 302 is equal to the mid-supply voltage therefore, no current flows in load resistor $R_B$ 306, such that substantially no current flows up through the collector of transistor 506. Practically, a very small value of trickle current continues to flow in the active biasing circuit, even when the input voltage $V_{IN}$ 302 is equal to the mid-supply voltage; and this small trickle current sets the quiescent current in the output transistors 406 and 408 to a very low value.

Looking again at FIG. 4, a schematic diagram illustrates the class 'AB' amplifier output stage 100 depicted in FIG. 1 modified with dynamic current mirrors 402, 404 for supplying collector currents for the amplifier output transistors 406, 408 according to one embodiment of the present invention. The class 'AB' amplifier output stage 400 is different however, in that it does not receive a fixed bias current provided by static current sources I, but instead receives a bias current from the active biasing circuit 304 that is modulated by the input voltage $V_{IN}$ 302. It can be appreciated then, that when the input voltage $V_{IN}$ 302 is at the mid-supply voltage during a quiescent period, the quiescent current will also be set to a low value as described herein before. The current supplied by the active biasing circuit 304 is then supplied to the current mirror 402 via transistor 506 and supplied to the current mirror 404 via transistor 508. The current supplied to the current mirror 402 is then used to drive the base of output transistor 406, while the current supplied to the current mirror 404 is used to drive the base of output transistor 408. Therefore, the output transistors 406, 408 will receive the requisite amount of base drive current to generate a large output signal, but will receive only a small amount of base drive current to generate a small output signal.

Figure 6:
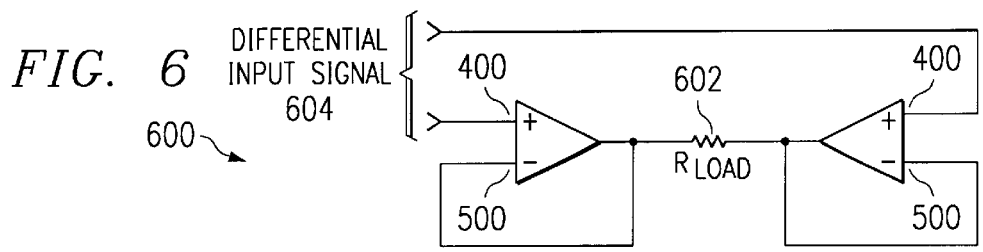
FIG. 6 is a simplified block diagram illustrating one application of the class 'AB' amplifier output stage and active biasing circuit shown in FIGS. 4 and 5 respectively.

FIG. 6 is a simplified block diagram illustrating one application of the class 'AB' amplifier output stage 400 and active biasing circuit 304 shown in FIGS. 4 and 5 respectively. An ADSL central office line driver 600 comprises two class 'AB' amplifier output stages 400, each having its bias current provided by the active biasing circuit 304. The amplifier output stages 400 are configured to generate an output signal to a load $R_{LOAD}$ 602 in response to a differential input signal 604.

In summary explanation, a class 'AB' amplifier output stage is provided with an active current biasing circuit that supplies base drive currents to the amplifier output transistors in such a way that very little current flows to the load whenever the input signal voltage level is at the mid-supply voltage. The supply current required by the class 'AB' amplifier output stage is therefore proportional to the input signal voltage level such that the quiescent current is significantly reduced below that required by conventional class 'AB' amplifier output stages; this feature is especially attractive for use with an ADSL central office line driver where the communication signals exhibit a large crest factor.

In view of the above, it can be seen the present invention presents a significant advancement in the art of class 'AB' amplifier output stage circuit technology. Further, this invention has been described in considerable detail in order to provide those skilled in the data communication art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, although various embodiments have been presented herein with reference to particular transistor types, the present inventive structures and characteristics are not necessarily limited to particular transistor types or sets of characteristics as used herein. It shall be understood the embodiments described herein above can easily be implemented using many diverse transistor types so long as the combinations achieve a low distortion class 'AB' amplifier output stage according to the inventive principles set forth herein above.

What is claimed is:

1. An amplifier circuit comprising:
   a class 'AB' amplifier output stage having a first output transistor responsive to a positive input signal and a second output transistor responsive to a negative input signal; and
   an active current biasing circuit operative to vary a base drive current associated with the first output transistor in response to the positive input signal and further operative to vary a base drive current associated with the second output transistor in response to the negative input signal such that quiescent current associated with the class 'AB' amplifier output stage is minimized when the input signal is at a mid-supply level and such that load current generated by the class 'AB' amplifier output stage increases linearly in response to increases in input signal level.

2. The amplifier circuit according to claim 1 wherein the class 'AB' amplifier output stage further comprises a first current mirror operative to communicate current generated by the active current biasing circuit to the first output transistor in response to the positive input signal and a second current mirror operative to communicate current generated by the active current biasing circuit to the second output transistor in response to the negative input signal.

3. The amplifier circuit according to claim 2 wherein the input signal is a voltage signal.

4. The amplifier circuit according to claim 1 wherein the active current biasing circuit comprises a class 'AB' amplifier output stage.

5. The amplifier circuit according to claim 4 wherein the active current biasing class 'AB' amplifier output stage comprises an upper output transistor responsive to the positive input signal and a lower output transistor responsive to the negative input signal.

6. The amplifier circuit according to claim 5 wherein the active current biasing class 'AB' amplifier output stage further comprises a first static current source operative to bias the upper output transistor in response to the positive output signal and a second static current source operative to bias the lower output transistor in response to the negative output signal.

7. The amplifier circuit according to claim 6 wherein the active current biasing class 'AB' amplifier output stage further comprises a boost resistor configured to set a maximum level for the load current.

8. An amplifier circuit comprising:
a first class 'AB' amplifier output stage having an active current biasing circuit operative to modulate a bias current associated with the first output stage in response to an input signal such that quiescent current associated with the first output stage is minimized when the input signal is at a mid-supply level and such that load current supplied by the first output stage increases linearly in response to increases in input signal level.

9. The amplifier circuit according to claim 8 wherein the active current biasing circuit comprises a second class 'AB' amplifier output stage having a static current biasing circuit, wherein the active current biasing circuit is operative to modulate a bias current generated by the static current biasing circuit in response to the input signal to generate the bias current associated with the first output stage and that is linearly decreased in response to a decreasing input signal and linearly increased in response to an increasing input signal.

10. A class 'AB' amplifier circuit comprising:
a first class 'AB' output stage; and
a second class 'AB' output stage operational to modulate a bias current associated with the first class 'AB' output stage in response to a voltage input signal, wherein the first class 'AB' output stage is operational to generate a load current in response to the voltage input signal and further in response to the modulated bias current such that the load current is minimized when the voltage input signal is at a mid-supply level and further such that the load current linearly increases with increases in the voltage input signal.

11. The class 'AB' amplifier circuit according to claim 10 wherein the first class 'AB' output stage comprises a first current mirror and a second current mirror wherein a bias current generated by the second class 'AB' output stage is communicated to the first current mirror in response to a positive input signal and further such that a bias current generated by the second class 'AB' output stage is communicated to the second current mirror in response to a negative input signal.

12. The class 'AB' amplifier circuit according to claim 11 wherein the second class 'AB' output stage comprises a pair of static current sources, and wherein the second class 'AB' output stage is operational to modulate current supplied by the pair of static current sources in response to the voltage input signal to generate the bias current associated with the first class 'AB' output stage.

13. The class 'AB' amplifier circuit according to claim 12 wherein the second class 'AB' output stage further comprises a boost resistor configured to establish a maximum bias current communicated to the first class 'AB' output stage in response to the voltage input signal.

14. An amplifier circuit comprising:
a first class 'AB' output stage having a first NPN output transistor and a first PNP output transistor, each transistor having its base driven via a respective driver transistor in response to a voltage input signal, each transistor further having its base configured to receive bias current via a respective current mirror in response to the voltage input signal; and
a second class 'AB' output stage having a second NPN output transistor and a second PNP output transistor, each second transistor having its base driven via a respective driver transistor in response to the voltage input signal, each second transistor further having its base configured to receive current via a respective static current source in response to the voltage input signal, wherein the second class 'AB' output stage is operational to modulate the bias current provided by the current mirrors such that the first class 'AB' output stage is capable of minimizing a quiescent load current in response to a mid-supply voltage input signal and further such that the first class 'AB' output stage is capable of generating a load current that increases as the voltage input signal increases.

15. The amplifier circuit according to claim 14 wherein the second class 'AB' output stage further comprises a boost resistor that is configured to establish a maximum load current level generated by the first class 'AB' output stage.

16. The amplifier circuit according to claim 15 wherein the second class 'AB' output stage further comprises a capacitor connected in parallel with the boost resistor and configured to provide drive current to parasitic capacitance associated with each second transistor.

17. The amplifier circuit according to claim 11 wherein the means for generating the modulated bias current is operational to minimize the bias current in response to a mid-supply voltage input signal and is further operational to generate a bias current that increases as the voltage input signal increases.

* * * * *